US010977469B2

(12) United States Patent
Wang et al.

(10) Patent No.: US 10,977,469 B2
(45) Date of Patent: Apr. 13, 2021

(54) HALO TEST METHOD FOR AN OPTICAL CHIP IN AN INTEGRATED CIRCUIT

(71) Applicant: Sino IC Technology Co., Ltd., Shanghai (CN)

(72) Inventors: Hua Wang, Shanghai (CN); Zhiyong Zhang, Shanghai (CN); Weiwei Deng, Shanghai (CN); Kun Yu, Shanghai (CN); Haiying Ji, Shanghai (CN); Bin Luo, Shanghai (CN)

(73) Assignee: Sino IC Technology Co., Ltd., Shanghai (CN)

( * ) Notice: Subject to any disclaimer, the term of this patent is extended or adjusted under 35 U.S.C. 154(b) by 0 days.

(21) Appl. No.: 16/442,379

(22) Filed: Jun. 14, 2019

(65) Prior Publication Data
US 2020/0311375 A1 Oct. 1, 2020

Related U.S. Application Data

(63) Continuation of application No. PCT/CN2019/084298, filed on Apr. 25, 2019.

(30) Foreign Application Priority Data

Mar. 29, 2019 (CN) .......................... 201910251137.7

(51) Int. Cl.
*G06K 9/00* (2006.01)
*G06K 9/03* (2006.01)
(52) U.S. Cl.
CPC ......... *G06K 9/00013* (2013.01); *G06K 9/036* (2013.01)

(58) Field of Classification Search
CPC ............. G06K 9/0004; G06K 9/00013; G06K 9/00006; G06K 19/0718; G06K 9/036
USPC .......................................................... 382/124
See application file for complete search history.

(56) References Cited

U.S. PATENT DOCUMENTS

2008/0144056 A1\* 6/2008 Ciurea ................... H04N 5/142
358/1.9

FOREIGN PATENT DOCUMENTS

| CN | 102435936 B | 9/2013 |
| CN | 105374726 B | 2/2018 |
| CN | 109461182 A | 3/2019 |
| CN | 109712137 A | 5/2019 |

\* cited by examiner

*Primary Examiner* — Koosha Sharifi-Tafreshi

(57) ABSTRACT

The present invention discloses a halo test method for an optical chip in an integrated circuit. A captured image array is processed as a circle by: dividing the array into circular patterns on the basis of the radius, reconstructing the circular patterns into a two-dimensional array according to coordinates, and then performing corresponding operations on the obtained array to obtain a desired value. By the halo test method for an optical chip in an integrated circuit provided in the present invention, without increasing any extra hardware cost and under the primary test conditions, the technical problem in the prior art that there is no well-developed method and algorithm for testing halo on a fingerprint on display (FOD) chip is solved.

8 Claims, 5 Drawing Sheets

HALO TEST METHOD FOR AN OPTICAL CHIP IN AN INTEGRATED CIRCUIT

CROSS-REFERENCE TO RELATED APPLICATIONS

This application is a continuation of International Application No. PCT/CN2019/084298, filed on Apr. 25, 2019, which claims priority from Chinese Patent Application No. 201910251137.7, filed on Mar. 29, 2019, both of which are hereby incorporated by reference in their entireties.

TECHNICAL FIELD

The technical solution is applied in fingerprint on display (FOD) chip tests and particularly relates to a halo test method for an optical chip in an integrated circuit.

BACKGROUND OF THE PRESENT INVENTION

In the prior art, in order to test halo on an optical chip in an integrated circuit, generally, the light-sensing array of the chip is irradiated by vertical and uniform light. Each pixel output is uniformly distributed. Due to the chip's own characteristics, pixels in the middle have high light sensitivity and pixels at the edge have low light sensitivity. FIG. 1 shows an image restored from the captured data by an FOD chip in a 208*160 array. In a conventional test, after capturing the data of the array, a mean value of the image and a mean value of rows/columns are calculated by the present well-developed algorithms to find any bad row/column, bad point in the image, shading (with great difference in luminance), etc. Those detection methods or algorithms are all based on rows, columns, points and blocks of the array. Halo may appear on FOD chips in certain faults or conditions. Pixel units with halo do not have a maximum or minimum value in a row, column or region. Therefore, by those algorithms, it is unable to detect the halo fault. The halo test method for an optical chip in an integrated circuit, as provided in the present application, is intended to solve this problem in halo test.

SUMMARY OF THE PRESENT INVENTION

To solve the above technical problem, the technical solution employed in the present invention is to provide a halo test method for an optical chip in an integrated circuit. During the test of an FOD chip, a light-sensing array (for example, 208*160, 33280 pixels in total) of a chip to be tested is irradiated by a light source. Each pixel in the light-sensing array generates weak current according to different illuminance. The current is output by an internal AD converter. During the test, data output by the AD converter is captured by automatic test equipment (ATE), and operations are performed on data of all pixels to obtain corresponding technical parameters of the chip.

In order to realize the above technical effect, the following specific technical solution is employed in the present invention:

(1) establishing a test environment, connecting a test system to an LED light source by fixing the LED light source on the back of a probe card, and controlling and adjusting the luminance of the light source by USB or GPIB;

(2) forming, according to a light-sensing area of a device to be tested, an opening on the probe card, from which a light-sensing array of the device is vertically irradiated by the light source;

(3) powering the device to be tested on, initializing a chip, generating a protocol vector to access the chip by a digital data generator of the test system, and acquiring pixel output of the chip by a digital sampling unit;

(4) processing a captured image array as a circle by: dividing the array into circular patterns on the basis of the radius, reconstructing the circular patterns into a two-dimensional array according to coordinates, and then performing corresponding operations on the obtained array to obtain a desired value, specifically:

1) capturing an image and arranging the image in a two-dimensional array according to X and Y coordinates;

2) according to the size of the array to be tested, using half of a smaller value of a row Y and a column X of the array as the maximum radius R of the halo;

3) converting the original image by using center coordinates of the original image as the center of a circle (0,0);

4) searching, from a range by taking the center of the circle as the coordinate center and having a radius of 1, for coordinates on the radius of the circle;

5) according to the selected coordinates and with a radius of R, reconstructing a two-dimensional array;

6) according to a row array, obtaining a mean value of pixels corresponding to all coordinates in each array;

7) converting the obtained mean value into a one-dimensional array M[ ]=[M1, M2, M3 ... MN];

8) performing operations on elements in the one-dimensional array M by adjacent difference:

$$X1=M2-M1;$$

$$X2=M3-M2;$$

$$XN-1=MN-MN-1$$

to obtain a one-dimensional array X[ ]=[X1, X2 ... XN−1]; and 9) obtaining a maximum value of an absolute value of the array X;

comparing the maximum value of the absolute value with a standard value for halo determination, and regarding the halo test failed if the maximum value of the absolute value exceeds the standard value, or otherwise regarding the halo test successful.

In the halo test method for an optical chip in an integrated circuit as described above, in the step 1), each coordinate in the array generally may be indicated by (X, Y), and a value corresponding to the coordinate is the pixel value of this point.

In the halo test method for an optical chip in an integrated circuit as described above, in the step 3), a circle is formed, having a left point (−80,0), a center point (0,0), a right point (80,0), a top point (0,80) and a lower point (0,−80).

In the halo test method for an optical chip in an integrated circuit as described above, in the step 4), the search is carried out as follows:

$$R=1,2,3,4 \ldots N;$$

when R=1, with a radius of 1, coordinates X and Y closest to the radius R are selected.

In the halo test method for an optical chip in an integrated circuit as described above, in the step 5), a two-dimensional array is formed in the step 5) as follows:

$$\text{Array}[R = 1] = [(1, 0), (0, 1), (-1, 0), (0, -1)]$$
$$\text{Array}[R = 2] = [(2, 0), (2, 1), (1, 2), (0, 2), (-1, 2),$$
$$(-2, 1), (-2, 0), (-2, -1), (-1, -2), (0, -2), (1, -2), (2, -1)]$$
$$\ldots$$
$$\text{Array}[R = N] = [(\,), (\,), (\,) \ldots].$$

Compared with the prior art, the present invention has the following beneficial effects: without increasing any extra hardware cost and under the primary test conditions, the technical problem in the prior art that there is no well-developed method and algorithm for testing halo on a fingerprint on display (FOD) chip is solved.

DETAILED DESCRIPTION OF THE PRESENT INVENTION

Automatic Test Equipment (ATE): automatic test equipment for a semiconductor integrated circuit (IC), which is used for detecting the completeness of functionality of an integrated circuit.

Wafer: a silicon wafer used for the preparation of a silicon semiconductor integrated circuit. Since it is circular, it is called wafer. Various circuit element structures can be manufactured on the silicon wafer to produce an IC product having particular electrical function.

Figure 1:
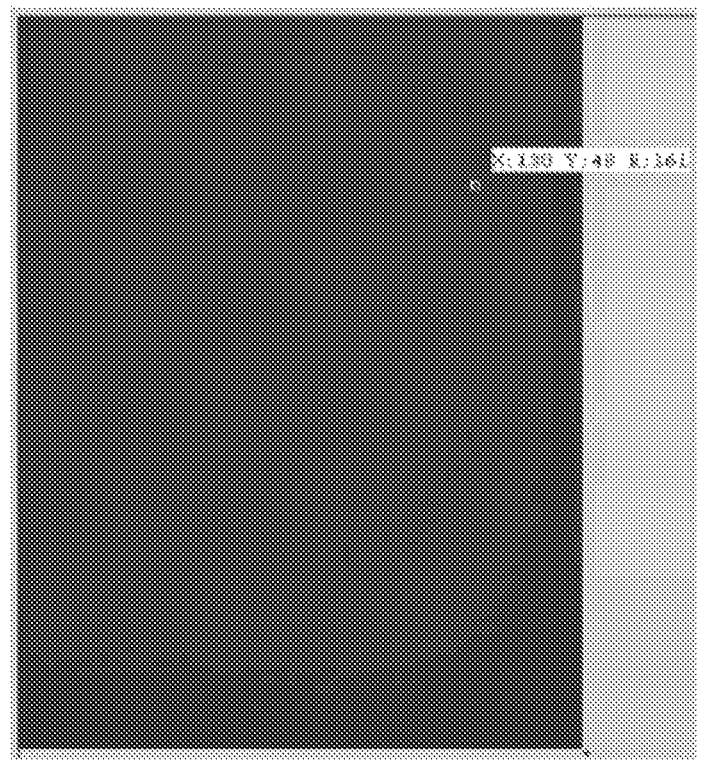
FIG. 1 is a schematic view showing an image restored from the captured data by an FOD chip in a 208*160 array.
Figure 2:
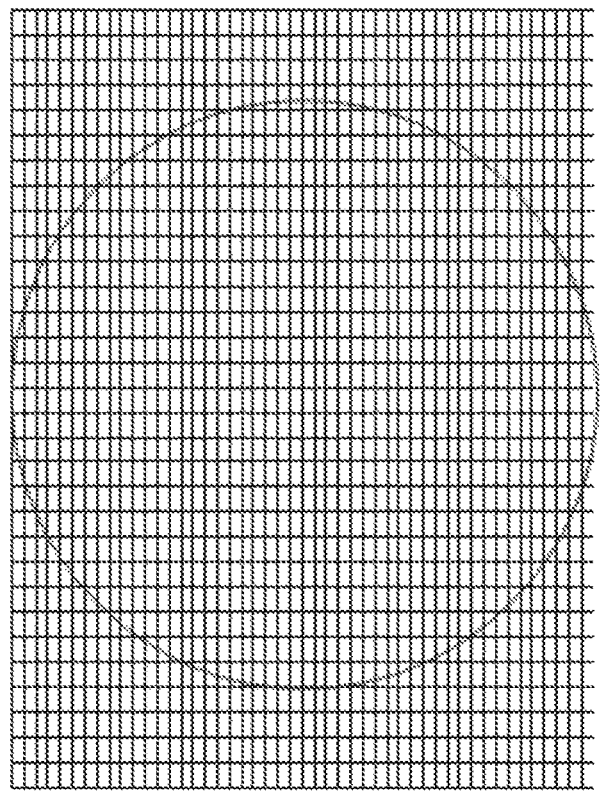
FIG. 2 is a schematic view of the generation of halo in a faulty chip.

In this technical solution, by rearranging and calculating pixel units in a light-sensing array in an FOD chip, the faulty chip with halo is found, as shown in FIG. 2.

Figure 3:
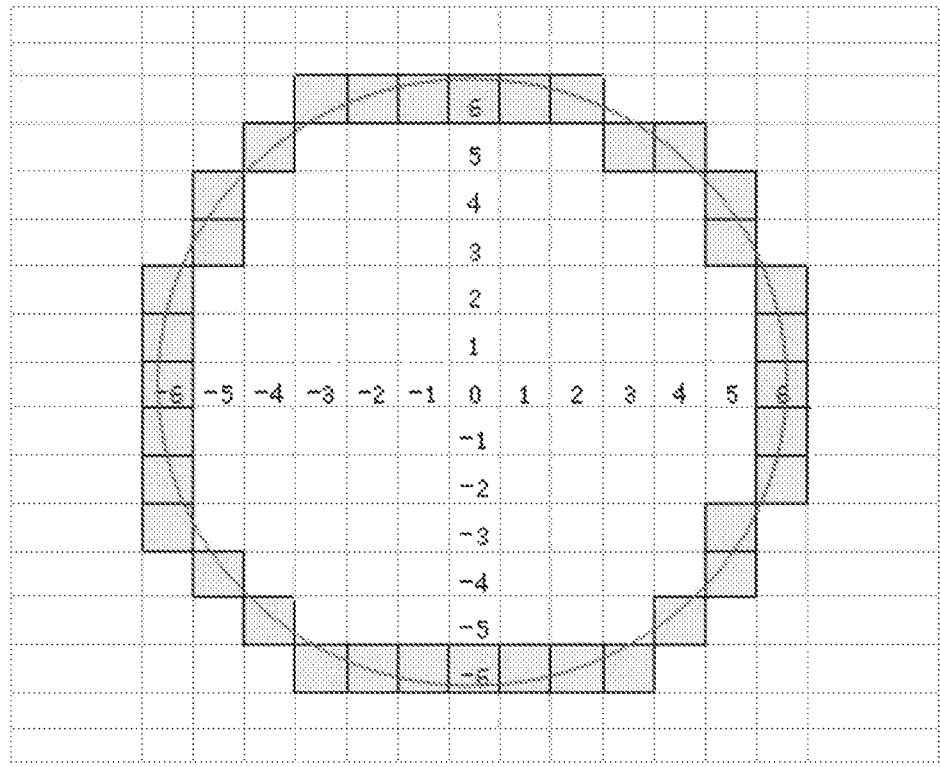
FIG. 3 is a schematic view of searching, from a range by selecting coordinates by R=6, taking the center of the circle as the coordinate center and having a radius of 1, for coordinates on the radius of the circle.
Figure 4:
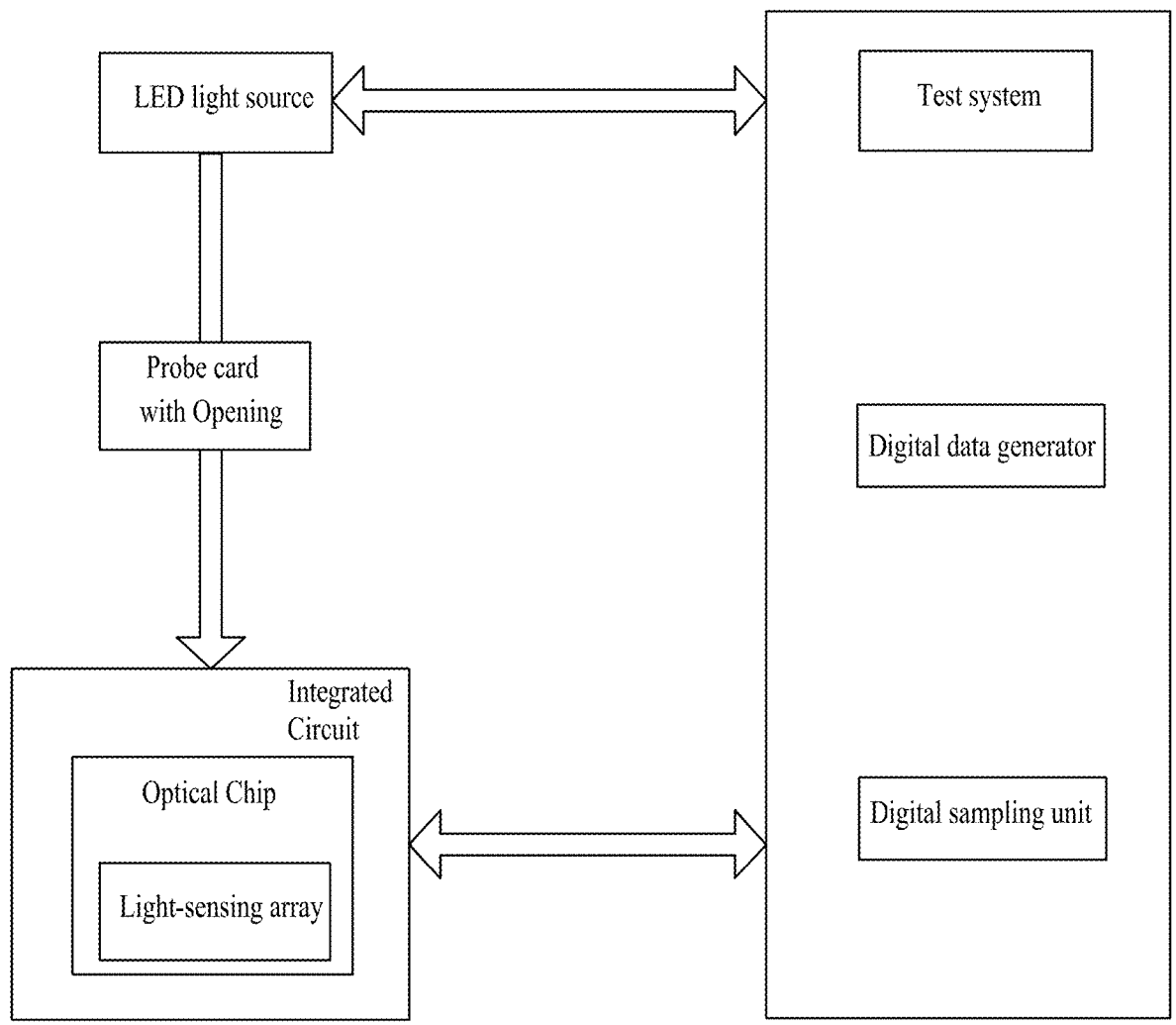
FIG. 4 is an architecture diagram of a test system.
Figure 5:
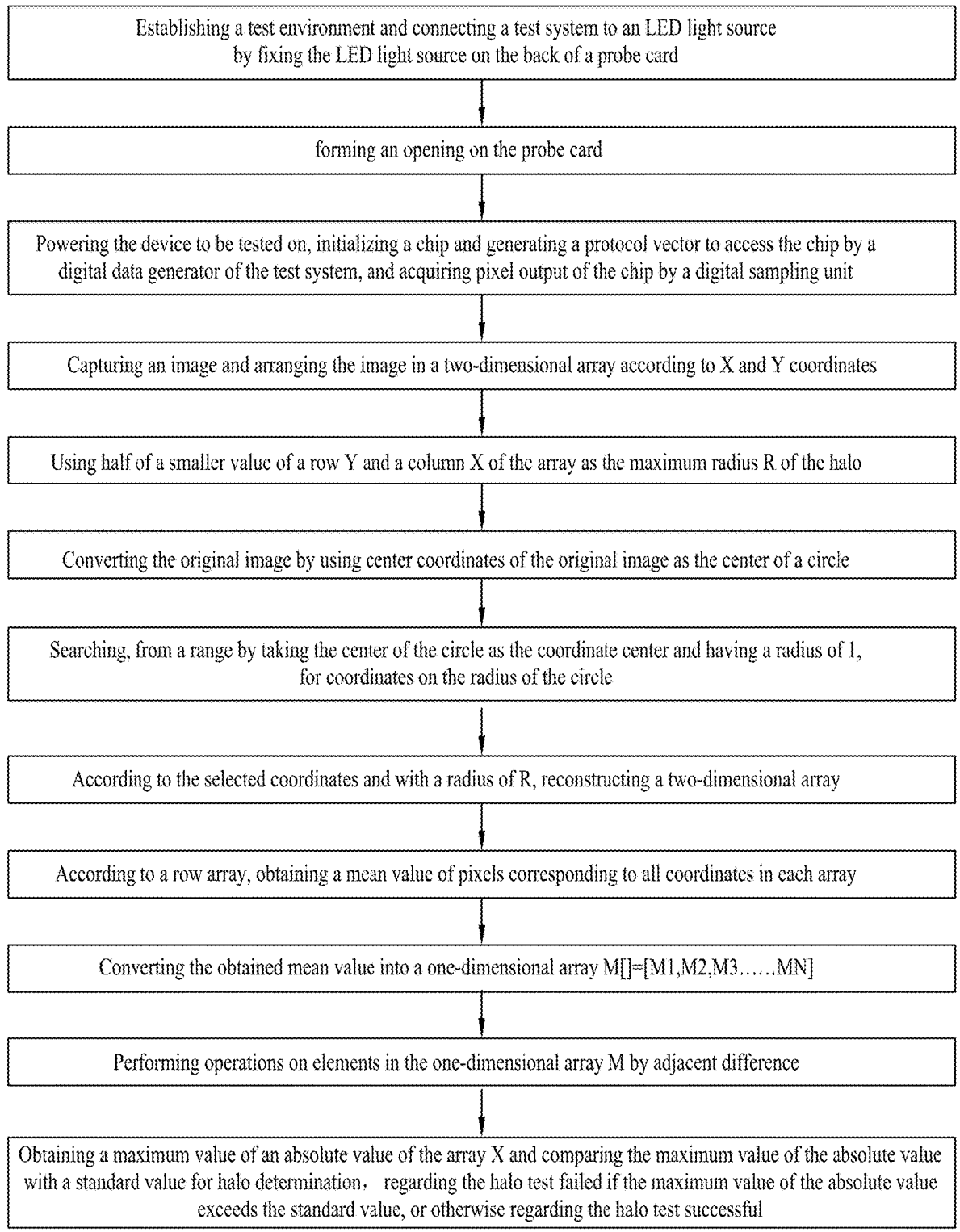
FIG. 5 is a flowchart of a halo test method for an optical chip in an integrated circuit.

This technical solution comprises following steps:

1. establishing a test environment, connecting a test system to an LED light source by fixing the LED light source on the back of a probe card, and controlling and adjusting the luminance of the light source by USB or GPIB;

2. forming, according to a light-sensing area of a device to be tested, an opening on the probe card, from which a light-sensing array of the device is vertically irradiated by the light source;

3. powering the device to be tested on, initializing a chip, generating a protocol vector to access the chip by a digital data generator of the test system, and acquiring pixel output of the chip by a digital sampling unit;

4. capturing, by the ATE, output of the device to be tested through a test module, restoring each element in the image array into a pixel point, arranging the elements of the image into a two-dimensional array according to X/Y coordinates by a software algorithm, where, each coordinate in the array generally may be indicated by (X,Y), and a value corresponding to the coordinate is the pixel value of this point;

5. according to the size of the array to be tested, using half of a smaller value of a row (Y) and a column (X) of the array as the maximum radius (R) of the halo, where, for example, 208*160, 160/2=80 is the maximum radius of the halo to be analyzed;

6. converting the original image by using center coordinates of the original image as the center of a circle (0,0), to form a circle having a left point (−80,0), a center point (0,0), a right point (80,0), a top point (0,80) and a lower point (0,−80);

7. searching, from a range by taking the center of the circle as the coordinate center and having a radius of 1, for coordinates on the radius of the circle, where, the search is carried out as follows:

$$R=1,2,3,4 \ldots N;$$

when R=1, with a radius of 1, coordinates X and Y closest to the radius R are selected. The algorithm for selecting the coordinates is not limited in this embodiment. FIG. 3 shows coordinates selected by R=6;

8. according to the selected coordinates and with a radius of R, reconstructing a two-dimensional array, for example:

$$\text{Array}[R = 1] = [(1, 0), (0, 1), (-1, 0), (0, -1)]$$
$$\text{Array}[R = 2] = [(2, 0), (2, 1), (1, 2), (0, 2), (-1, 2),$$
$$(-2, 1), (-2, 0), (-2, -1), (-1, -2), (0, -2), (1, -2), (2, -1)]$$
$$\ldots$$
$$\text{Array}[R = N] = [(\,), (\,), (\,) \ldots];$$

9. according to a row array, obtaining a mean value of pixels corresponding to all coordinates in each array;

10. converting the obtained mean value into a one-dimensional array M[ ]=[M1, M2, M3 . . . MN];

11. performing operations on elements in the one-dimensional array M by adjacent difference, for example:

$$X1=M2-M1;$$
$$X2=M3-M2;$$
$$XN-1=MN-MN-1$$

to obtain a one-dimensional array X[ ]=[X1,X2 . . . XN−1]; and 12. obtaining a maximum value of an absolute value of the array X;

comparing the maximum value of the absolute value with a standard value for halo determination, and regarding the halo test failed if the maximum value of the absolute value exceeds the standard value, or otherwise regarding the halo test successful.

The technical solution of the present invention provides a test algorithm. According to the above steps, first, a captured image array is processed as a circle by: dividing the array into circular patterns on the basis of the radius, reconstructing the circular patterns into a two-dimensional array according to coordinates, and then performing corresponding operations on the obtained array to obtain a desired value.

To test an optical chip, the common algorithms in the art are based on rows, columns, points and blocks of the array. Inevitably, some device faults cannot be accurately detected.

In the technical solution of the present invention, by detecting particular device fault models by circular patterns, the defects of the conventional algorithms are overcome. The main innovation of the technical solution of the present invention is the design of such novel patterns. Both the algorithms for acquiring the patterns and the algorithms for performing operations and determinations are not limited.

What is claimed is:

1. A halo test method for an optical chip in an integrated circuit, comprising: establishing a test environment and connecting a test system to an LED light source by fixing the LED light source on the back of a probe card; forming, according to an area of a light-sensing array of the optical chip to be tested, an opening on the probe card, from which the light-sensing array of the optical chip is irradiated by the light source; powering the integrated circuit on, initializing the optical chip, generating a protocol vector to access the optical chip by a digital data generator of the test system, and acquiring pixel output of the optical chip by a digital sampling unit, wherein:
a captured image array is processed as a circle by: dividing the array into circular patterns on the basis of the radius, reconstructing the circular patterns into a two-dimensional array according to coordinates, and then performing corresponding operations on the obtained array to obtain a desired value, specifically:
1) capturing an image and arranging the image in a two-dimensional array according to X and Y coordinates;
2) according to the size of the array to be tested, using half of a smaller value of a row Y and a column X of the array as the maximum radius R of the halo;
3) converting the original image by using center coordinates of the original image as the center of a circle, the coordinates being (X=0, Y=0);
4) searching, from a range by taking the center of the circle as the coordinate center and having a radius of 1, for coordinates on the radius of the circle;
5) according to the selected coordinates and with a radius of R, reconstructing a two-dimensional array;
6) according to a row array, obtaining a mean value of pixels corresponding to all coordinates in each array;
7) converting the obtained mean value into a one-dimensional array M[ ]=[M1, M2, M3 MN], wherein N is the maximum radius R of the halo;
8) performing operations on elements in the one-dimensional array M by adjacent difference:

$X1=M2-M1;$ $X2=M3-M2;$ $XN-1=MN-MN-1$ to obtain a one-dimensional array X[ ]=[X1, X2 XN−1]; and
9) obtaining a maximum value of an absolute value of the array X;
comparing the maximum value of the absolute value with a standard value for halo determination, and regarding the halo test failed if the maximum value of the absolute value exceeds the standard value, or otherwise regarding the halo test successful.

2. The halo test method for an optical chip in an integrated circuit according to claim 1, wherein, in the step 1), each coordinate in the array generally may be indicated by (X,Y), and a value corresponding to the coordinate is the pixel value of this point.

3. The halo test method for an optical chip in an integrated circuit according to claim 2, wherein, in the step 3), a circle is formed, having a left point (−80,0), a center point (0,0), a right point (80,0), a top point (0,80) and a lower point (0,−80).

4. The halo test method for an optical chip in an integrated circuit according to claim 2, wherein, in the step 4), the search is carried out as follows:

$R=1,2,3,4 \ldots N;$ when R=1, with a radius of 1, coordinates X and Y closest to the radius R are selected.

5. The halo test method for an optical chip in an integrated circuit according to claim 1, wherein, a two-dimensional array is formed in the step 5) as follows:

$Array[R = 1] = [(1, 0), (0, 1), (-1, 0), (0, -1)]$ $Array[R = 2] = [(2, 0), (2, 1), (1, 2), (0, 2), (-1, 2),$ $(-2, 1), (-2, 0), (-2, -1), (-1, -2), (0, -2), (1, -2), (2, -1)]$

...

$Array[R = N] = [(N, 0) \ldots (0, N) \ldots (-N, 0) \ldots (0, -N)].$

6. The halo test method for an optical chip in an integrated circuit according to claim 2, wherein, a two-dimensional array is formed in the step 5) as follows:

$Array[R = 1] = [(1, 0), (0, 1), (-1, 0), (0, -1)]$ $Array[R = 2] = [(2, 0), (2, 1), (1, 2), (0, 2), (-1, 2),$ $(-2, 1), (-2, 0), (-2, -1), (-1, -2), (0, -2), (1, -2), (2, -1)]$

...

$Array[R = N] = [(N, 0) \ldots (0, N) \ldots (-N, 0) \ldots (0, -N)].$

7. The halo test method for an optical chip in an integrated circuit according to claim 3, wherein, a two-dimensional array is formed in the step 5) as follows:

$Array[R = 1] = [(1, 0), (0, 1), (-1, 0), (0, -1)]$ $Array[R = 2] = [(2, 0), (2, 1), (1, 2), (0, 2), (-1, 2),$ $(-2, 1), (-2, 0), (-2, -1), (-1, -2), (0, -2), (1, -2), (2, -1)]$

...

$Array[R = N] = [(N, 0) \ldots (0, N) \ldots (-N, 0) \ldots (0, -N)].$

8. The halo test method for an optical chip in an integrated circuit according to claim 4, wherein, a two-dimensional array is formed in the step 5) as follows:

$Array[R = 1] = [(1, 0), (0, 1), (-1, 0), (0, -1)]$ $Array[R = 2] = [(2, 0), (2, 1), (1, 2), (0, 2), (-1, 2),$ -continued $(-2, 1), (-2, 0), (-2, -1), (-1, -2), (0, -2), (1, -2), (2, -1)]$

...

$\text{Array}[R = N] = [(N, 0)\ldots (0, N)\ldots (-N, 0) \ldots (0, -N)].$

* * * * *